United States Patent [19]

Nations et al.

[11] 4,276,654

[45] Jun. 30, 1981

[54] SCAN-LOCK CONTROL OF SOLID STATE DIGITALLY SYNTHESIZED RECEIVERS

[75] Inventors: William N. Nations, Alameda, Calif.; Kenneth H. Kerwin, II, Londonderry, N.H.

[73] Assignee: Pacific Marine Electronics, Inc., Oakland, Calif.

[21] Appl. No.: 30,568

[22] Filed: Apr. 16, 1979

Related U.S. Application Data

[63] Continuation-in-part of Ser. No. 741,294, Nov. 12, 1976, abandoned.

[51] Int. Cl.³ .......................... H04B 1/16; H03J 7/18
[52] U.S. Cl. ................................. 455/160; 455/161; 455/349; 455/352
[58] Field of Search ............................ 361/391–395; 455/145–148, 151, 160, 161, 347, 348, 349, 352, 353; 370/88, 89

[56] References Cited

U.S. PATENT DOCUMENTS

| | | | |
|---|---|---|---|
| 2,238,391 | 4/1941 | Masters | 325/470 |
| 3,449,749 | 6/1969 | McEvoy | 325/334 |
| 3,803,494 | 4/1974 | Howell et al. | 325/469 |
| 3,886,453 | 5/1975 | Quintiliani et al. | 325/25 |

OTHER PUBLICATIONS

"SBE Opti/Scan", printed 8–1976.
Radio Electronics, May 1973 on "Heath's Digital FM Tuner", pp. 42–45, 50, 98.
"Scan–Lock Control of Digitally Synthesized Receivers" by Nations et al., 4/28/1976.
"Station–Memory Component for the 77 Super–Colour Series", by Clas, 1976.

*Primary Examiner*—Jin F. Ng
*Attorney, Agent, or Firm*—Robert Charles Hill

[57] ABSTRACT

A scan-lock control device is provided for use with a high frequency receiver in a manner which adds frequency scanning and lock-up functions to the receiver without affecting any of the receiver's other functions. The scan-lock control incorporates an interface unit which can be operatively connected to the receiver to interconnect scanning and lock-up circuits to the receiver. The scan-lock device also incorporates a novel multiplexer unit which is modular and expandable and has a plurality of plug-in cards operatively associated therewith; each card having programmed thereon a frequency data channel which may be selectively scanned.

17 Claims, 7 Drawing Figures

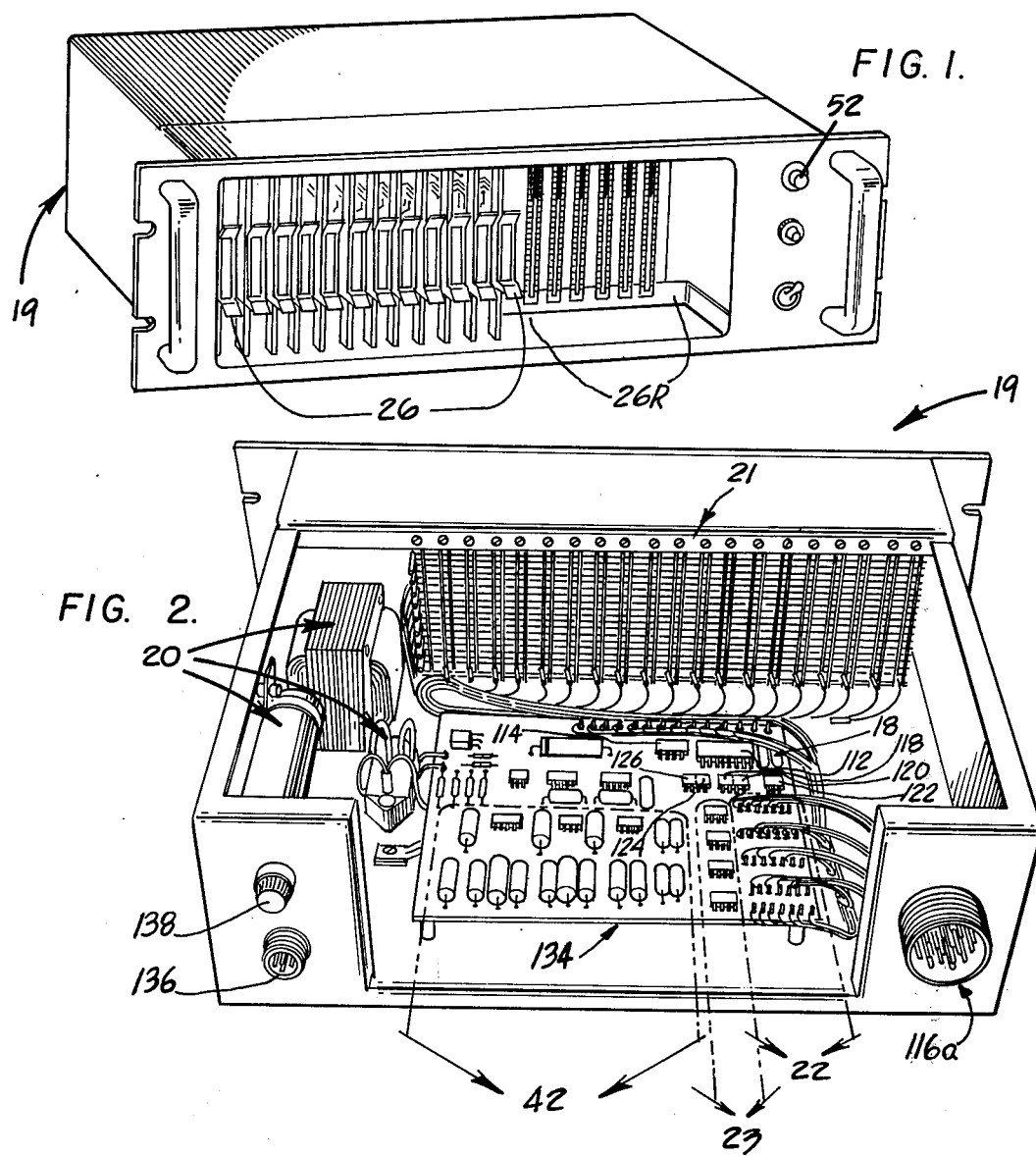
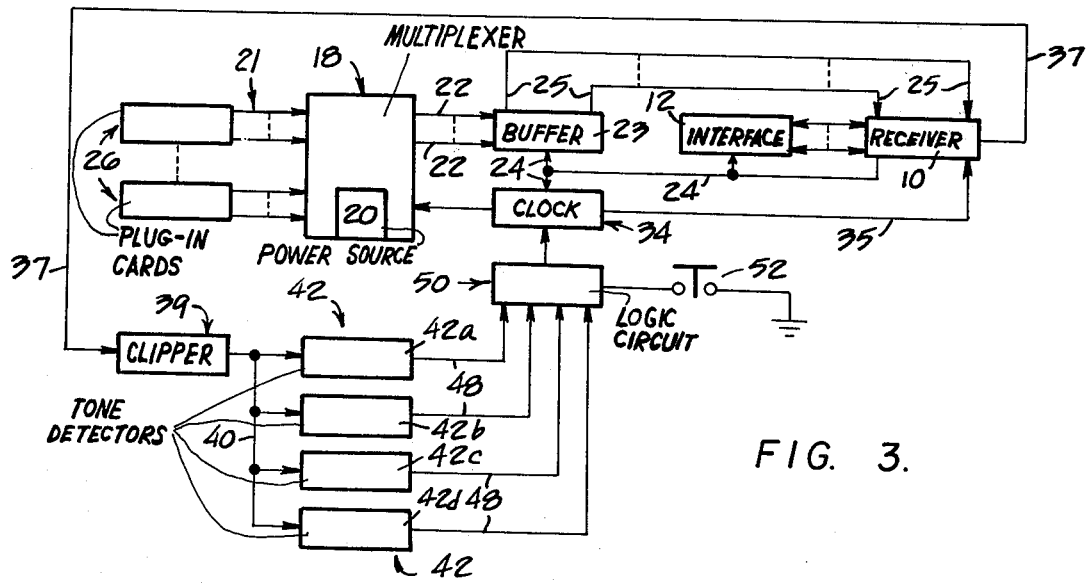
FIG. 1.
FIG. 2.
FIG. 3.

SCAN-LOCK CONTROL OF SOLID STATE DIGITALLY SYNTHESIZED RECEIVERS

BACKGROUND OF THE INVENTION

This invention relates to a scan-lock control for use with radio receivers. The invention more particularly relates to a scan-lock control device for use with solid state, digitally synthesized receivers. Specifically the present invention incorporates a chassis, separate from the receiver to be scanned, having scanning and lock-up circuits with a power supply therefor, a group of plug-in circuit cards which may be plugged into the chassis and each having one of the frequency channels to be scanned programmed thereon, and an interface component interconnected with or physically mounted within the receiver for interconnecting the scan-lock control and receiver in such a way as to add the frequency scanning and lock-up functions without affecting any of the receiver's other locally controlled functions.

Operational requirements exist to scan a list of high frequency (HF) radio frequencies. One example is the "Digital Selective Call Device" under development by GTE Sylvania. Another is the existing Bell System two-tone selective ringer. Unattended radioteletype reception is still another application where automatic acquisition of the optimum HF frequency is required. The requirement exists at both ship stations and coast stations.

The requirement for HF multi-frequency reception has been traditionally met in the prior art by a number of single frequency receivers equal to the number of frequencies to be received. This is typically one frequency in each of the six marine HF bands for each station being watched. If more than one station is to be watched, the number of receivers becomes prohibitive.

If automatic reception of teletype or selective ringing on single side band is being employed, the receivers must be quite stable, and therefore quite expensive.

An emerging requirement in ships for unattended reception of selective call signals and direct printing signals has given rise to the need for reception on several radio frequencies, either simultaneously or sequentially. It is precisely this requirement which the scan-lock control device of the present invention is intended to satisfy. The recent appearance in ships of digitally synthesized receivers has made it possible to satisfy this need both economically and reliably.

In the shipboard application, the output of the synthesized radio receiver is fed to a selective call device. This device may be an existing Bell System two-tone selective ringer, common on many ships, or the digital selective caller under development by GTE Sylvania.

Still another application on shipboard is the unattended reception of direct printing signals, using the teletype stunt box as a selective call selector. A similar application is particularly common in naval ships which receive direct printing broadcast more or less continuously.

In the case of either type of selective ringer or of the direct printing terminal, the coast station or stations from which the ship might expect to receive calls or signals, transmits on a family of frequencies. These are typically one frequency each in the 4, 6, 8, 12, 16 and 22 MHz marine bands. One or more of these frequencies can be expected to reach the desired ship at the time of day and at the distance between the coast and the ship stations.

The frequency which will best reach the ship which it is intended to selectively call or communicate with, will change on a daily basis as the ship steams from place to place, and on an hourly basis as the sun's position around the earth affects ionospheric propagation of radio waves.

It is therefore unreasonable to set a radio receiver to a single frequency and expect it to receive signals from a distant coast station for any length of time. As the distance, but more important, the time of day changes, the optimum frequency will change. When the selective call device or direct printer is placed on watch, the frequency to which the receiver is initially set will receive signals at the time, but after a period ranging from a few minutes to a few hours, the frequency will fade. Unless the receiver is returned to that frequency in the family of frequencies transmitted by the coast station which most closely approximates the optimum frequency, satisfactory signals will no longer be received and the selective call device to which the receiver is connected will be, for all practical purposes, inoperative.

Certainly, a single frequency cannot be expected to continue to receive satisfactory signals from a distant coast station during the twelve-hour period that ship's radio officers are normally "off watch."

The problem of changing propagation and changing optimum frequency has traditionally been solved by fitting a number of receivers equal to the number of frequencies in the family of frequencies employed by the coast station. This is typically five or six frequencies.

If a number of receivers, each tuned to one of the family of frequencies is employed, the cost gets multiplied five or six times. If more than one coast station is to be watched by the ship, each with a family of five or six frequencies, the cost becomes prohibitive. Together with increased cost comes an increase in the failure rate as the amount of equipment in the system increases.

Moreover, the receivers employed for selective calling or for direct printing must be of an uncommonly high order of frequency accuracy and stability. GTE Sylvania reports that differences in the frequency of the ship's receiver and the frequency of the distant coast station transmitter as small as five Hertz results in a measurable increase in the data error rate. This agrees with direct printing experience wherein it is endeavored to maintain ship station transmitter frequencies within five Hertz. Those knowledgeable in the field agree that the data error rate mounts to an unacceptable magnitude when the frequencies differ by more than twenty Hertz. Radio receivers of such frequency accuracy and stability are especially expensive.

A simpler solution which forms the crux of the present invention and which is at once more economical and more reliable is a novel scan-lock receiver. A number of solid state digitally synthesized receivers have made their appearance on board ships in recent years. Under the present invention, these can now be processor controlled to scan a list of frequencies, stopping and locking onto the frequency on which satisfactory selective call or direct printing signals are received. Some receivers may also have to be frequency stabilized using an external standard.

The scan-lock control of the present invention is designed to determine whether or not a selective call signal or direct printing signal is present and to stop the scan and lock onto the frequency when, but only when, these signals are present. Happily, the GTE Sylvania selective call device and direct printing both accept audio frequencies of ±Hz shift centered on 1,500 Hz. This permits detection of the discrete audio tones 1,415 Hz and 1,585 Hz for both GTE Sylvania selective calling and for direct printing. The direct printing may employ Simplex TOR or CODEX error correction systems without affecting the scan-lock's ability to detect tones and lock onto the frequency. Of course, unprotected direct printing signals will also lock up the scan-lock control.

The Bell System two-tone selective ringer employs the two audio tones; 600 Hz and 1,500 Hz, alternated at 10 Hz.

The scan-lock device has therefore been designed in one embodiment to lock up on either tone pair; i.e. GTE Sylvania and direct printing at 1,415 Hz and 1,585 Hz, and Bell System at 600 Hz and 1,500 Hz.

Preferably, single side band voice, AM carrier, or CW will not lock up the scan-lock device. Therefore, normal radio traffic on the frequencies being scanned are ignored by the scanlock control, but selective call and direct printing signals are detected and locked onto.

The output of the radio receiver is connected to one or more of the selective call and direct printing components, and once the scan-lock control has stopped the frequency scan on a frequency which provides satisfactory signals, these components determine whether the particular ship is being selective called or not. If the selective call is for the ship, the alerting devices associated with the selective call decoder summons the radio officer or turns on equipment to receive a message to be read by him when he next comes on watch.

If the selective call is not for the ship, the call decoder will remain quiescent. Upon removal of the selective call signal, the scan-lock control resumes its search for a satisfactory frequency.

A digitally synthesized solid state receiver in combination with the scan-lock control device of the present invention provides the highest probability of receiving selective calls directed to the ship at the lowest cost and with the greatest equipment reliability.

One of the primary objects of the present invention is to provide a scan-lock control for a synthesized receiver of adequate stability. A synthesizer's ability to switch rapidly from one frequency to another, coupled with the relative ease of achieving high frequency stability, makes it well suited for this application.

Another object of the present invention is to provide a scan-lock control device for existing models of marine solid state digitally synthesized receivers. Under the present invention, a list of up to twenty discrete and field-programmable frequencies can be scanned at a rapid rate.

A further object and advantage of the invention is that lock-on frequency is achieved only when one or more of four discrete ringer or teletype tones is received.

Other objects and advantages of the present invention, in addition to those specifically mentioned above, will become readily apparent in the course of the following specification.

BRIEF DESCRIPTION OF THE DRAWING

The accompanying drawing shows, by way of example, a preferred embodiment of the invention.

In the drawing:

FIG. 1 is an isometric view illustrating the front panel of the chassis which houses the scan-lock control of the present invention;

FIG. 2 is an isometric view illustrating the rear portion and inner circuitry of the chassis which houses the scan-lock control of the present invention;

FIG. 3 is a diagrammatic general view illustrating the manner in which the scan-lock control device of the present invention is interconnected with a high frequency receiver;

DESCRIPTION OF THE PREFERRED EMBODIMENT

Figure 4:
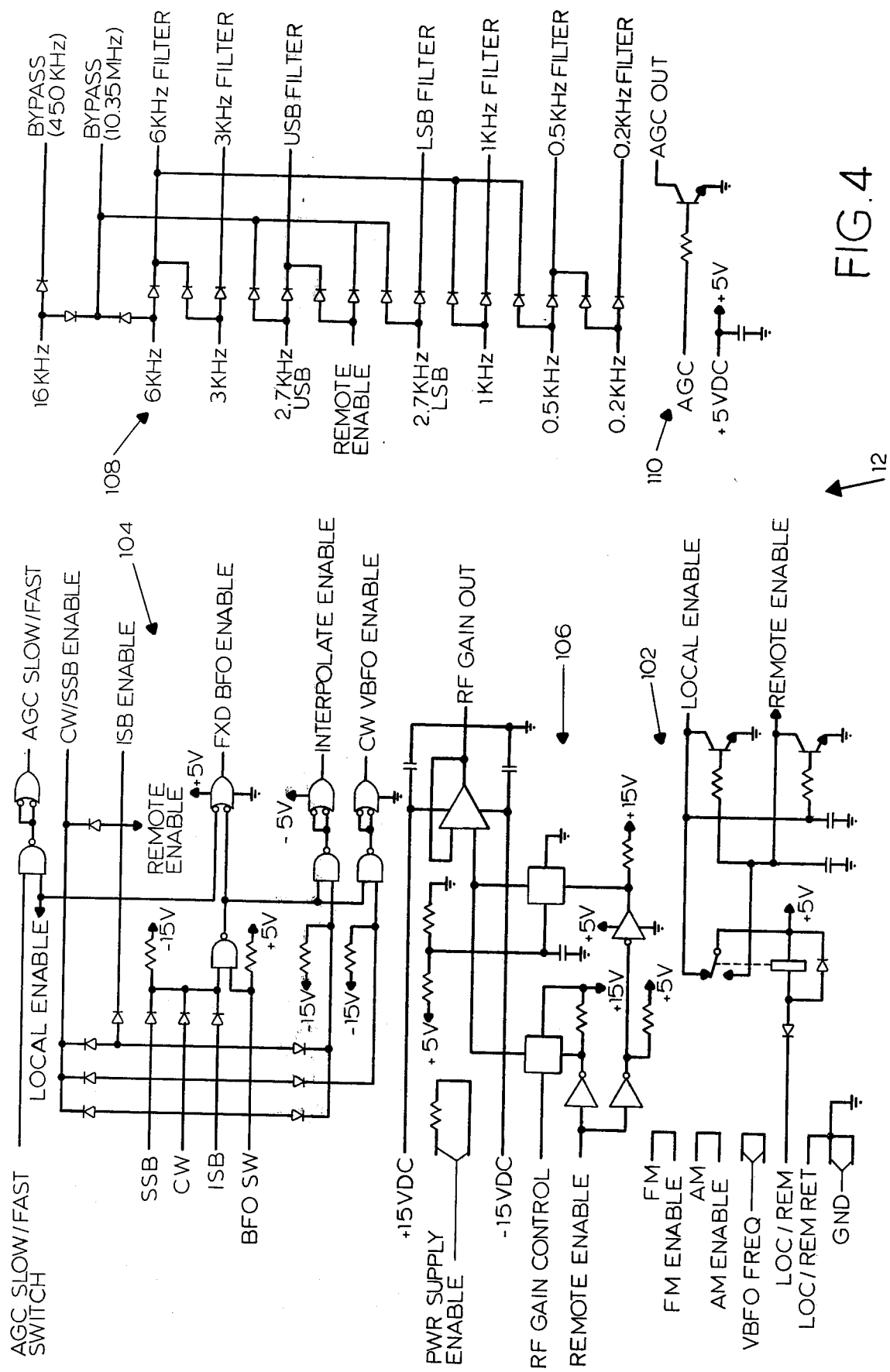
FIG. 4 is a schematic representation of an interface circuit card particularly adapted for use with a Collins Radio model 651-S-1 receiver.

In the following description, the scan-lock control device of the present invention is initially described with reference to the views of FIGS. 1 and 2 and the diagrammatic view of FIG. 3. It is believed that the circuitry and mode of operation for each of the components illustrated in FIGS. 1-3 will be apparent from the initial portion of the description. However, in order to more clearly define the invention, the circuitry of the various components in FIGS. 1-3 is illustrated in greater detail in FIGS. 4-7 toward which the subsequent portion of the description is directed.

Referring now to FIG. 3 in conjunction with FIGS. 1 and 2, there is shown a high frequency receiver 10 which may be one of several existing multi-frequency marine solid state digitally synthesized models. Examples of such receivers include, but are not limited to, Collins Radio model 651-S-1, and ITT Mackay Marine models 3020A and 3021A (or N). For purposes of the present description, a Collins Radio model 651-S-1 was chosen. The Collins receiver shown at 10 has a "local/remote" switch (not shown) and also provides a slot for a plug-in interface card, diagrammatically shown at 12, within the receiver cabinet.

For this particular receiver, an interface circuit card 12 was designed and built to plug into the receiver slot and the interface has hard-wired into it the settings of all available front panel controls, except for frequency, that are designed for scan-lock operation. The receiver functions completely normally in its "local" mode, with or without a scan-lock control connected thereto. When the receiver 10 is switched to the "remote" mode, its front panel control settings are electrically replaced by those programmed into the interface 12, and the receiver's frequency is determined by the external scan-lock control. The operator of the receiver may switch between local and remote at any time.

As best shown in FIG. 3, the scan-lock control comprises several major components including a multiplexer assembly 18, a plurality of plug-in cards 26, a multiplexer clock 34, a plurality of tone detectors 42, and a gating logic circuit 50.

The heart of the scan-lock control is a modular, expandable multiplexer assembly shown generally at 18. The multiplexer assembly is contained in a chassis 19 which has a power source 20 and output signal bus lines 22. The multiplexer assembly may be thought of as a large automatic switch, which sequentially selects frequency data from the plug-in cards 26, as binary-coded decimal (BCD) numbers. Since human beings are accustomed to working with decimal numbers, digitally-synthesized receivers have decimal digit frequency readouts, but internally handle their frequency-determining information in an 8-4-2-1 BCD code. This code uses four signal lines for each decimal digit, assigning a numerical value of 8 to the most significant line, 4 to the next, 2 to the next, and 1 to the least significant line. Any decimal digit from 0 through 9 can be represented by a combination of logical "assertions" (usually a positive voltage) and "negations" (usually ground potential) on these four signal lines.

For a typical high frequency receiver, tuning to a maximum frequency of 30 MHz in increments of 100 Hz (0.1 KHz), a total of 22 signal lines, or "bits" of data are needed to carry a complete "word" of frequency-determining information. That is, four bits each for the 0.1 KHz, 1 KHz, 10 KHz, 100 KHz and 1 MHz digits, and two bits each for the 10 MHz digit (since it never goes over 3). Thus, the multiplexer assembly 18, and the plug-in cards 26, must handle 22-bit words.

When designing the multiplexer, it was realized that circuits therefor in common use require a large "overhead" of circuitry to be installed, even when only a few channels are to be used, and furthermore, restrict the number of channels to a power of two (i.e. 2, 4, 8, 16, 32, etc.). This unreasonably increases the cost and decreases the flexibility, particularly in the smaller systems. Accordingly, part of the invention resides in eliminating the integrated circuits customarily employed in such multiplexers. Instead the multiplexer of the present invention has been designed to be completely modular, and expandable to accept any number from one to twenty of the plug-in cards 26. As a result, much of the digital logic circuitry usually associated with multiplexers has been eliminated with a substantial cost savings realized thereby. This improvement over prior art devices has been accomplished by moving part of the multiplexing function to the plug-in cards themselves, instead of building the entire function into the main chassis of the multiplexer. Because only as many plug-in cards 26 need be provided as frequency channels to be scanned, the system cost is now more nearly proportional to the number of channels, and a significant initial "overhead" cost has been eliminated. This is especially important in systems with a relatively small number of scanned channels.

The 20-channel multiplexer assembly 18 scans, or sequentially selects, the 22-bit frequency data words at a rate of about four per second, driven by the multiplexer clock 34. The multiplexer clock 34 is a free running clock which is enabled any time the receiver 10 is switched to its remote mode, until the gating logic 50 stops the clock on a frequency where reception is adequate. Output data bits from the multiplexer assembly 18 are transmitted through the output signal bus lines 22 to the multiplexer buffers 23 where the data bits are buffered through so-called "tri-state" logic gates. The multiplexer buffers 23 function to place signals (either a positive voltage or ground) through lines 25 onto frequency selection data lines located at the receiver 10, only when the remote mode is selected at the receiver, and is otherwise electrically disconnected. This is accomplished by means of a local/remote control line 24 interconnected between the receiver 10 and both the multiplexer clock 34 and the multiplexer buffers 23. This setup avoids disturbance of the internal workings of the receiver 10 when the receiver is in the local mode. The local/remote control line 24 also inhibits the multiplexer clock 34 in the local mode to eliminate the noise associated with digital switching and resets the scan so it always starts with the first plug-in card 26 whenever the remote mode is again selected.

Internally, the multiplexer assembly 18 has been reduced to just a counter, driven by the multiplexer clock 34, which sequentially applies data from each plug-in card 26 in turn onto common output signal bus lines 22, while disabling data from all other cards. An internal jumper is wired so as to reset the counter when it reaches the n+1 count (where n=the number of plug-in cards 26 actually installed), so the scanning encompasses any arbitrary number of plug-in cards, but does not include any vacant card slots. This jumper can easily be made a front panel switch, if desired, to accommodate frequent changes in the number of channels to be scanned.

As also shown in FIG. 3, a load frequency pulse line 35 connected between the clock 34 and receiver 10 was necessary for this particular receiver to provide a "load frequency" pulse to load each 22-bit frequency word into the receiver circuits. The multiplexer clock 34 provides a pulse through the line 35 which pulse is delayed sufficiently after each multiplexer step to allow the frequency data signal lines to settle prior to loading each word.

The details of the plug-in cards 26 will now be discussed. Each frequency-determining plug-in card embodies two components: a set of jumpers into which the 22-bit frequency word is hard-wired; and a set of logic gates like those in the multiplexer buffers 23. The inputs to the logic gates are continuously connected to the jumpers, but outputs from the gates are applied to the multiplexer common output bus lines 22 only when each card is specifically enabled in turn by the multiplexer's counter. Thus, only one card's data bits appear on the output buses 22 at any given time, and the switching function is performed on the plug-in cards.

Hard-wired jumpers for the frequency selection were chosen to avoid the potential for accidental changes which could occur if switches were used. These were physically located on the cards, however, in such a way that commercially available subminiature switches can be mounted instead, if desired. Frequency data bits are set into either the jumpers or switches in the 8-4-2-1 BCD code previously described, with one 22-bit word programmed onto each separate card. These cards can be supplied pre-programmed for installation by untrained people in the field, or a jumpering table can be provided to enable technical personnel to set or change card programming.

If the multiplexer is the heart of the scan-lock control, the tone detectors 42 and their associated logic circuits are its brain. This part of the circuitry determines when the received radio signals are adequate for tone reception, locks the scanning process for as long as this remains true and resumes scanning whenever the signals become inadequate.

Receiver audio, taken from the receiver 10 output line 37 so as to be independent from an operator's local audio, is first applied to a combined bandpass filter, preamplifier, and clipper shown generally at 39. The bandpass filter attenuates signal components in the received audio which are outside the frequency range of interest, but which might interfere with reliable detection of the desired tones. The preamplifier amplifies the filtered audio signal, and incorporates an integral clipper, so its output amplitude remains constant regardless of the incoming audio signal level from the receiver. This is desirable both to prevent spurious outputs from the tone detectors due to overloads at their inputs, and to assure constant capture ranges for the detectors, whose bandwidths would otherwise be dependent upon the input signal level.

The processed audio is then applied via conduit 40 to four integrated circuit phase-locked loop tone detectors 42. One pair, shown at 42a and 42b, are set at 600 Hz and 1500 Hz, to detect the tones used for Bell System signalling. The other pair, shown at 42c and 42d, are set for 1415 Hz and 1585 Hz, to detect the tones spaced 170 Hz apart that are used for standard narrow-shift radioteletype and selective calling transmissions.

Each phase-locked loop has its detection and lock bandwidths, and acquisition and release time constant, individually tailored to the tone it detects. This is necessary because the 600/1500 Hz tone pair has a frequency tolerance of ±50 Hz for each tone, and a switching rate limited to 20 pulses per second, while the 1415/1585 Hz pair has frequency tolerances of ±20 Hz and a switching rate of 100 band.

The capture bandwidth for each detector was made wide enough to accept any tone within its specified tolerance, but narrow enough to provide good rejection of other tones which might also be present in the received signal. The lock bandwidth, or frequency range over which the loop will remain locked on a signal already acquired, is intrinsically somewhat larger, so once a tone has been acquired, it may drift somewhat outside its specification before it is rejected. The center frequency for each tone is adjustable, so each detector may be set exactly.

The acquisition time for each loop must be fast enough to produce a lock within one bit time of the transmitted signal, or the detector would not produce an output when the tone is being keyed between the two frequencies of a pair, as in normal radioteletype reception. However, the release time must be made long enough that the loop does not become unlocked during either normal keying or short noise bursts in otherwise acceptable signals, or spurious scanning would result.

Since there is unavoidably considerable interaction between loop bandwidths and response times in a phase-locked loop, some compromises are usually required. Satisfactory trade-offs between the bandwidths and acquisition times were obtained, but in order to obtain adequately long release times, it was necessary to add, following each detector, a retriggerable pulse-generating circuit to stretch the release times to acceptable values. This increased circuit complexity slightly but neatly provided independent control of acquisition and release times for each loop.

The outputs from the four tone detectors 42 are supplied to the gating logic 50 by means of conduits 48. The gating logic 50 enables the multiplexer clock 34 to step the multiplexer assembly 18 to the next frequency only if there is no output from any detector 42. Conversely, presence of an output from any one of the detectors 42 locks the multiplexer assembly 18, for so long as reception remains adequate. Thus a teletype "mark hold" tone for either pair locks up the multiplexer assembly 18, as will an actual teletype signal keyed between the tones of either pair, and the receiver remains tuned to that frequency until the tone(s) disappear or radio reception fails. The fast acquisition/slow release characteristic of the detectors 42 provides the overlap needed to prevent stepping away during teletype keying or occasional short noise bursts in the signal. A manual step push button 52 has been provided, as the only operator control, so the operator can elect to step the multiplexer assembly 18 off a locked frequency to examine the others.

Considerable effort was devoted to selecting, for each tone pair, a combination of bandwidths and acquisition and release times which should provide an optimum balance between accepting usable signals and rejecting spurious ones. Obviously, there is no way to protect against locking up on, say, a strong and steady heterodyne note at 1500 Hz (although the multiplexer will step away once the heterodyne ceases). But, except under truly atrocious reception conditions, the parameters chosen will provide reliable unattended radioteletype operation.

Referring now to the more detailed circuit representations of FIGS. 4–7, an interface circuit card 12 suitable for use in conjunction with a Collins radio model 651-S-1 receiver is represented in FIG. 4. As noted above, the receiver 10 is of a type particularly adapted to receive such an interface circuit card in order to regulate its operation. It is again noted that a number of other receivers could be used in conjunction with the present invention but that a different interface circuit card, particularly adapted for the selected receiver, would then be necessary. However, the construction and operation of interface circuit cards for other receivers will be apparent from the following description.

As was also noted above, the receiver 10 is of a type including a local/remote switch which may be placed in its local mode in order to permit operation of the receiver by its normal controls, arranged for examle, upon a front panel of the receiver unit. However, when the receiver 10 is switched to its remote mode, its normal front panel controls are electronically replaced by those programmed into the interface circuit card 12. Accordingly, the interface circuit card merely includes an array of normal electrical circuit components including connectors, diodes, logic gates, integrated circuits, amplifiers, etc. The specific arrangements of these components is not described in their entirety since such a description is not believed necessary for a complete understanding of the invention.

Generally, the interface circuit card 12 includes a circuit assembly generally indicated at 102 which conditions the receiver to enable either local or remote operation. Another circuit portion 104 is adapted to enable operation of the automatic gain slow-fast control for the receiver as well as to enable the receiver for single side band (SSB), continuous wave (CW) or independent side band (ISB) modes of operation and finally to enable operation of the beat frequency oscillator in the receiver.

Yet another circuit portion 106 of the interface circuit card 12 is adapted to set the radio frequency gain control of the receiver for maximum volume. A separate circuit portion 108 enables one of a number of various filter and bypass functions within the receiver. Output for the automatic gain control is established by yet another circuit portion 110.

In reviewing the circuitry within the interface circuit card 12, as shown in FIG. 4, the various interconnections for the interface card with the receiver are indicated by abbreviated descriptions which are believed to clearly define the function and operation of the interface circuit card when considered together with the conventional Collins Radio model 651-S-1 receiver which is particularly contemplated for use with the present invention.

Figure 5:
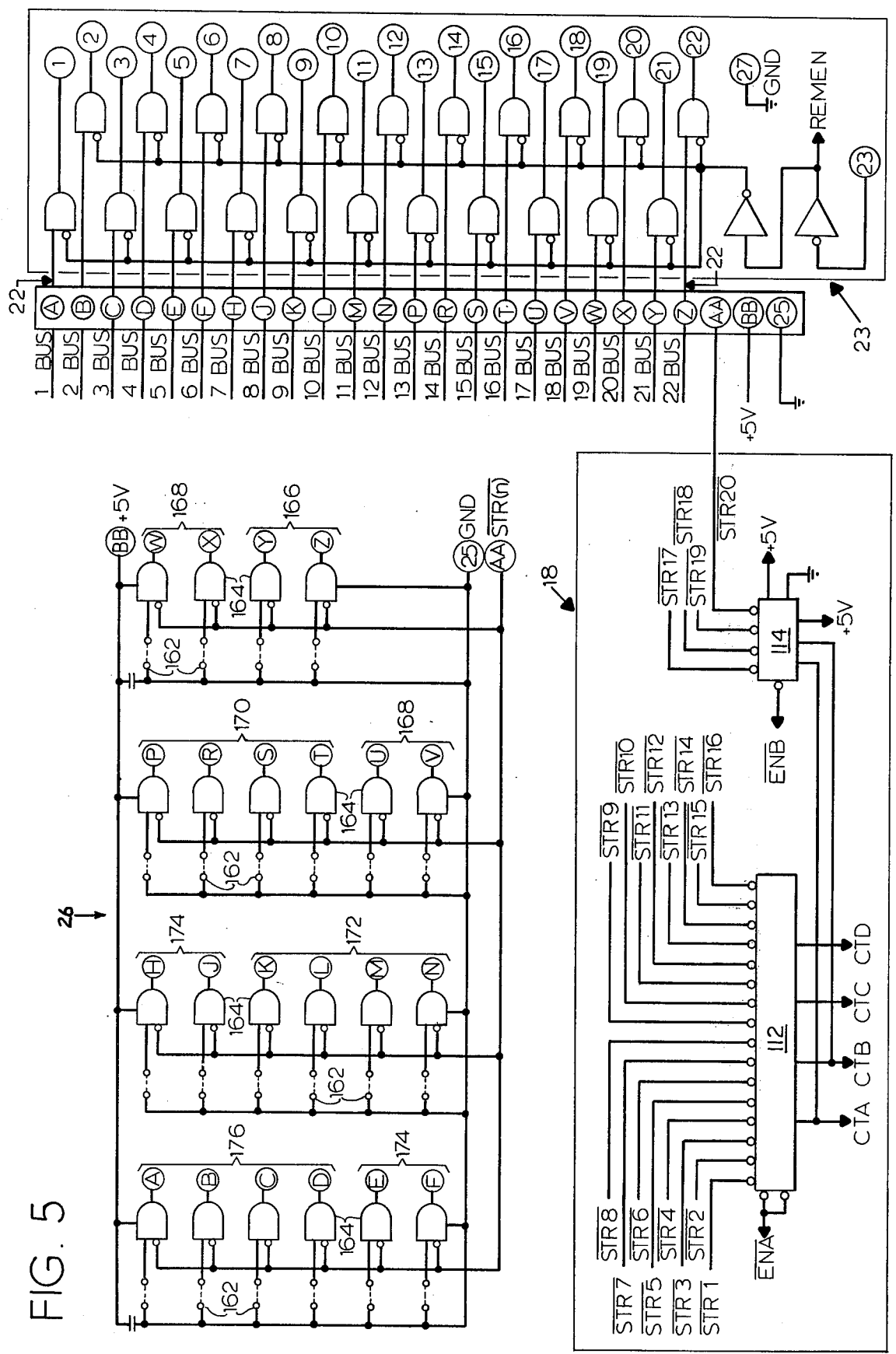
FIG. 5 is a schematic representation of a portion of the scan-lock diagram of FIG. 3 illustrating interaction of the plug-in cards 26 with the multiplexer 18 and the buffer 23.
Figure 6:
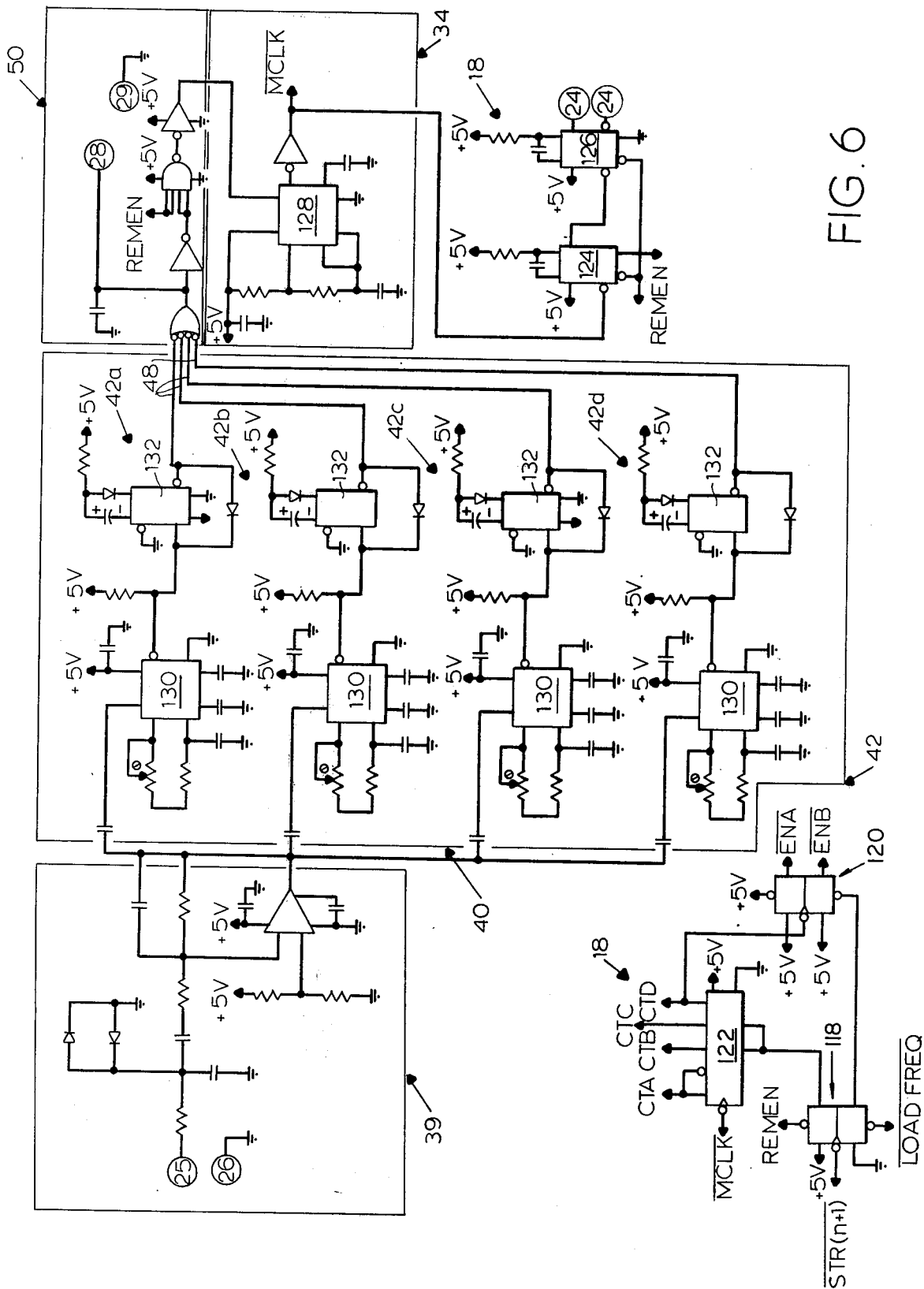
FIG. 6 is a schematic representation of the remaining portions of the multiplexer 18 along with the clipper 39, tone detector array 42, logic circuit 50 and clock 34.
Figure 7:
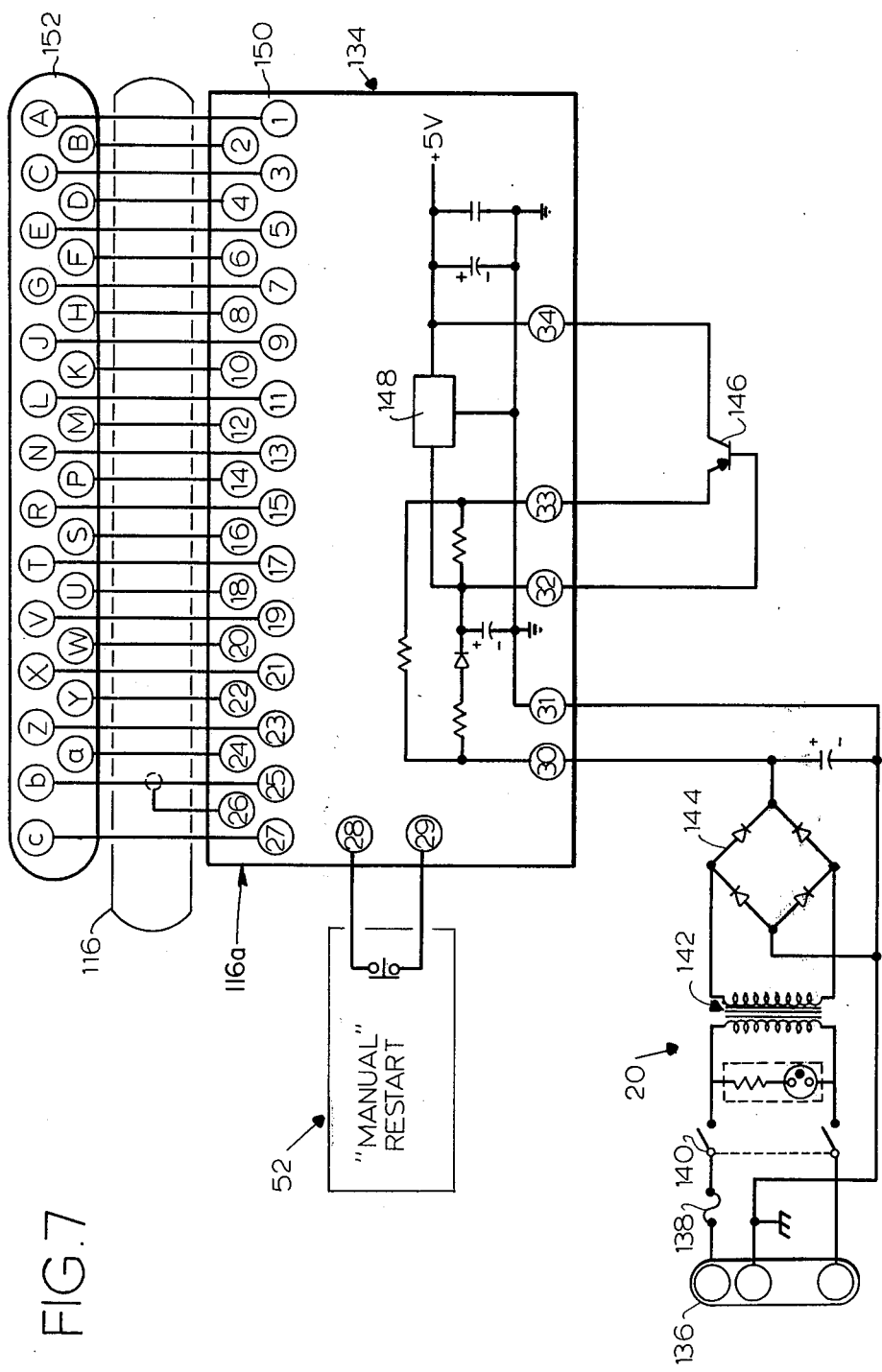
FIG. 7 is a schematic representation of a main circuit board for the scan-lock device while also illustrating other portions of its circuit, particularly the power source 20.

Before proceeding with a description of the remaining FIGS. 5-7, it is noted that various components in these drawings are interconnected with other components which cannot always be shown on the same figure. Accordingly, within FIGS. 5-7, interconnections for the various circuit components are indicated by circled letters or numerals which do not correspond with the numerical labels employed in the description and appearing uncircled in the figures.

FIG. 5 illustrates a portion of the scan-lock device circuitry which permits use of a selected plurality of the plug-in cards 26 for establishing various frequencies to be scanned by the receiver. Accordingly, initial reference is also made to FIGS. 1-3 in order to better understand the identity of certain components. Twenty plug-in card receptacles, one of which is shown in its entirety at 26, are arranged upon the chassis 19, a portion of the receptacles being illustrated in FIG. 1 as containing respective plug-in cards 26. One of the plug-in card receptacles 26R is also illustrated in FIG. 5 adjacent a schematic representation of a single plug-in card 26 suitable for interconnection the receptacle 26R. An array of twenty such plug-in card receptacles is provided in the chassis 19, each of the plug-in card receptacles being interconnected with a separate output line from integrated circuits 112 and 114. The output lines from the integrated circuits are labeled in FIG. 5 by the letters STR followed by a separate numeral corresponding to each of the twenty receptacles.

The integrated circuits 112 and 114 form a portion of the multiplexer assembly 18 which will be further described below. For the present, it is sufficient to understand that a single integrated circuit could be employed for interconnection with all of the receptacles 26R. However, two such integrated circuits are employed as indicated at 112 and 114 merely to have a sufficient number of output lines for respective interconnection with the twenty receptacles 26R. In addition, each of the receptacles 26R includes a number of connectors represented by encircled letters or the encircled numeral 25. The connections represented by encircled letters A-Z are present within each of the receptacles 26R and are commonly connected with separated bus lines which are also collectively indicated at 22 in FIG. 3. A grid is indicated at 21 in FIG. 2 for interconnecting the various receptacles 26R with the bus lines 22. As may also be seen in FIG. 5, the grid 21 and bus line connections 22 are respectively connected through independent logic gates in the buffer 23 with output connections indicated by encircled numbers 1-23 and 27. These outputs are coupled with appropriate portions of the receiver 10 through a connector 116 and receptable 116a. The receptacle 116a may also be seen on the back of the chassis 19 in FIG. 2.

Referring now to FIG. 6, additional integrated circuits 118, 120, 122, 124 and 126 are interconnected with each other, with the integrated circuits 112 and 114 in FIG. 5 and with other components within the scan-lock device apparatus as indicated in the drawings. The interconnection of the integrated circuit 124 with the clock 34 and the interconnection of the integrated circuits 112 and 114 with the various receptacles 26R provide the timing sequence for scanning of selective frequencies established by the various plug-in cards 26. The clock 34 is of generally conventional circuitry including an integrated circuit 128 and associated components for establishing a timing sequence within the circuit under regulation of the logic circuit 50.

During operation of the receiver 10, its output signal is carried by the line 37 to the clipper 39 (see FIG. 6) which performs the combined band path filter, preamplifier and clipper functions referred to above. The signal thus conditioned by the clipper 39 is carried by the branched line 40 to the array of tone detectors generally indicated at 42. Each of the independent tone detectors, indicated respectively at 42a, 42b, 42c and 42d, includes a series arrangement of integrated circuits 130 and 132 together with various other circuit components which detect the presence or absence of a particular signal in accordance with the preceding description for the tone detectors. The presence or absence of the respective tones or signals is communicated to the logic circuit 50 through the lines 48. As noted above, the logic circuit 50 functions in response to the presence or absence of these tones to either permit continuing cycled operation of the multiplexer clock 34 or else interrupts operation of the clock in the event that the presence of one of the selected tones is signalled by one of the detectors 22a-42d.

Referring to FIG. 7, a main circuit board for the scan-lock device is indicated at 134 and includes portions of the power source (see FIG. 3) as well as other components described immediately below. The power source 20 includes a connector 136 for external connection, a fuse 138, switching means 140, a transformer 142, a rectifier 144, a transistor 146 and regulator circuit 148 which are interconnected as shown in FIG. 7. The external connector 136 and the fuse 138 may also be seen in FIG. 2 at the rear of the chassis 19.

The manual restart switch indicated at 52 in FIG. 3 is also illustrated in FIG. 7 within the main circuit board. Connections for the manual restart switch 52, as indicated by the encircled numerals, are completed with the integrated circuit 50 in FIG. 6 where the same encircled numerals appear.

Finally, the connector 116 illustrated on the back of the chassis 19 in FIG. 2 also appears in FIG. 7 and, as is illustrated there, includes the connecting lines 24, 25, 35 and 37, as illustrated in FIG. 3. Accordingly, those numerical labels are shown in parentheses beneath the numerical label 116 identifying the connector. As is illustrated in FIG. 7, the connector 116 is internally connected within the main circuit board to the various connections in the buffer 23, the clipper 39 and the multiplexer clock 34. As may also be seen by reference to the integrated circuit 126 in FIG. 6, the connection between the connector 116 and the multiplexer clock 34 is made through the multiplexer 18. The internal connections within the main circuit board 134 for the connector 116 are generally indicated at 150. A corresponding plurality of external connections are indicated at 152 and represent a conventional coupling (not otherwise shown) from the receiver 10 to mate with the connector 116.

Referring again to FIG. 5 in conjunction with FIG. 3, it may be seen that the frequencies to be scanned by the receiver are established by a plurality of the plug-in cards 26 which are arranged in the receptacle 26R of the chassis for interconnection with the multiplexer 18 and other components in the circuit of FIG. 3. One of the plug-in cards 26 is schematically represented in FIG. 5 adjacent the receptacle into which it may be plugged. As noted above, each of the plug-in cards 26 contains a sequence of jumpers and logic gates respectively connected in series. When the plug-in card 26 is arranged in the receptacle 26R, each of the series connected jumpers and logic gates is also interconnected with one of the bus lines in the connection 22. In FIG. 5, the respective jumpers are each indicated at 162 while the logic gates are each indicated at 164. The hard wired configuration of each of the plug-in cards 26 to include these components was described above along with the mode of operation for the plug-in cards. A separate set of such series arrangements are provided to permit selection of each digit in a frequency to be loaded by the particular plug-in card 26. For example, it may be assumed that the plug-in card 26 illustrated in FIG. 5 is to be adapted for loading the frequency 17,274.3 Hertz. The first, or "1 MHz," digit is established by a pair of the series arrangements indicated at 166. Only two such series arrangements are necessary for the first digit since it will not exceed a value of "3." The second, or "100 KHz," digit 7 is established by a set of four series arrangements indicated at 168 in two locations of FIG. 5. The third, or "10 KHz," digit 2 is selected by a set of four series arrangements indicated at 170. The successive digits in the frequency to be loaded may similarly be selected by the respective sets of series arrangements indicated at 172, 174 and 176. It will, of course, be immediately apparent that the frequency to be loaded for any particular plug-in card may be readily adjusted in order to facilitate a modified mode of operation for the scan-lock control device of the present invention.

The techniques and embodiments described and shown here can be expanded to include other receivers, different combinations of tone pairs and signal keying rates, and any arbitrary number of scanned frequency channels. The modular design of the scan-lock control makes such modifications particularly easy to implement as new requirements arise.

It is apparent that the embodiments of the invention which have been described above have been given by way of illustration and not by way of limitation and that they are capable of many variations and modifications within the basic scope of the invention and within the scope of the appended claims.

I claim:

1. A scan-lock control device for use with a high frequency receiver, which receiver is provided with a local/remote switch and a specially designed interface so that the receiver functions normally in its local mode and is controlled in its remote mode to add frequency scanning and lockup functions without affecting any of the receiver's other locally controlled funtions, wherein said scan-lock control device comprises:
   (a) multiplexer means for sequentially selecting frequency data, said multiplexer having a power source and output bus lines operatively connected thereto,
   (b) a plurality of frequency-determining, plug-in card means operatively connected to the multiplexer means for supplying predetermined frequency data embodied in each card to the multiplexer when any one of said cards is activated by the multiplexer,
   (c) multiplexer clock means operatively connected to both the receiver and the multiplexer and activated any time the receiver is switched to its remote mode, said multiplexer clock thereby providing a driving means for said multiplexer,
   (d) a plurality of tone detectors means operatively connected to both the receiver and the multiplexer clock, said tone detector means having means connected therewith to determine when receiver audio output signals are adequate for tone reception, and
   (e) gating logic means operatively connected to both the tone detectors and the multiplexer clock for either enabling the multiplexer to step the multiplexer to the next frequency if there is no output from any tone detector, or to lock the multiplexer in its present frequency when output signals from the receiver remain adequate.

2. A scan-lock control device as set forth in claim 1 wherein each plug-in card comprises a 22-bit frequency word.

3. A scan-lock control device as set forth in claim 1 wherein the multiplexer has a plurality of card slots for receiving the plug-in cards, each of which has been programmed to one of the frequency channels to be scanned.

4. A scan-lock control device as set forth in claim 3 wherein the multiplexer has twenty card slots for receiving up to twenty plug-in cards.

5. A scan-lock control device as set forth in claim 3 wherein each plug-in card comprises a 22-bit frequency word.

6. A scan-lock control device as set forth in claim 5 wherein each plug-in card further comprises:
   (a) jumper means into which the 22-bit frequency word has been hard wired, and
   (b) logic gate means having input means and output means operatively connected therewith.

7. A scan-lock control device as set forth in claim 6 and further comprising:
   (a) first connector means for continuously connecting the logic gate input means to said jumper means, and
   (b) second connector means for connecting the logic gate output means to a common output bus line associated with the multiplexer only when said plug-in card is specifically activated by a counter means associated with the multiplexer.

8. A scan-lock control device as set forth in claim 2 wherein the multiplexer further comprises counter means driven by the multiplexer clock for sequentially applying frequency data from each plug-in card into the multiplexer output bus lines, while disabling data from all other cards.

9. A scan-lock control device as set forth in claim 8 wherein said multiplexer further comprises a jumper wired to reset the counter means when said counter reaches the n+1 count (where n=the number of plug-in cards actually installed), whereby the scanning function encompasses any arbitrary number of plug-in cards.

10. A scan-lock control device as set forth in claim 1 wherein a load frequency pulse circuit is provided between the multiplexer clock and the receiver for providing a pulse sufficiently delayed after each multiplexer step to allow the frequency data signal to settle prior to loading another frequency from the plug-in cards.

11. A scan-lock control device as set forth in claim 1 wherein multiplexer buffer means are provided between the multiplexer output bus lines and the receiver.

12. A scan-lock control device as set forth in claim 11 wherein the multiplexer buffer means comprise tri-state logic gates.

13. A scan-lock control device as set forth in claim 1 wherein manual step means are operatively connected to the gating logic means so that an operator may manually step the multiplexer off a locked frequency and examine others.

14. A scan-lock control device as set forth in claim 1 wherein a combined bandpass filter, preamplifier, and clipper are provided in the receiver's audio frequency output circuit and are operatively connected to the tone detectors, whereby the bandpass filter attenuates signal components in the received audio which are outside the frequency range of interest, the preamplifier amplifies the filtered audio signal and the clipper maintains the output amplitude from the amplifier in a constant state thereby preventing spurious outputs from the tone detectors due to input overload and assuring constant capture ranges for said tone detectors.

15. A scan-lock control device as set forth in claim 1 wherein each of said tone detectors comprises an integrated circuit phase-locked loop, each loop having detection and lock bandwidths, and acquisition and release time constants individually tailored to the tone it detects.

16. A scan-lock control device as set forth in claim 15 comprising four integrated circuit phase-locked loop tone detectors.

17. For use with a scan-lock control device and a solid state digitally synthesized high frequency receiver, a multiplexer expandable to accept a plurality of plug-in cards comprising:
- (a) a chassis having said multiplexer therein,
- (b) a power source connected to the chassis,
- (c) scanning and lockup circuits connected to the chassis and operatively connected to the power source,
- (d) a plurality of slots provided in the chassis and operatively connected with the scanning and lockup circuits,
- (e) a plurality of plug-in circuit cards receivable in said slots and having programmed thereon a frequency data channel to be scanned, and
- (f) output signal lines for sending data from the cards,
- (g) said multiplexer having a counter and multiplexer clock means operatively connected therewith to drive the counter, whereby the multiplexer sequentially applies data from each plug-in card in turn onto the output signal lines, while disabling data from all other cards.

* * * * *